(12) United States Patent
Chandrasekaran et al.

(10) Patent No.: US 11,979,084 B2
(45) Date of Patent: May 7, 2024

(54) ACTIVE CLAMP DC/DC CONVERTER INCLUDING CURRENT SENSE PEAK CONTROL MODE CONTROL

(71) Applicant: Raytheon Company, Waltham, MA (US)

(72) Inventors: Sriram Chandrasekaran, Lucas, TX (US); Bruce Stoltz, Tucson, AZ (US); Marty Perry, Tucson, AZ (US); Noel Delgado, Oro Valley, AZ (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 17/893,495

(22) Filed: Aug. 23, 2022

(65) Prior Publication Data

US 2024/0072641 A1 Feb. 29, 2024

(51) Int. Cl.
*H02M 3/335* (2006.01)
*H02M 1/00* (2006.01)
(Continued)

(52) U.S. Cl.
CPC ......... *H02M 1/325* (2021.05); *H02M 1/0009* (2021.05); *H02M 1/0087* (2021.05);
(Continued)

(58) Field of Classification Search
CPC ............ H02M 3/00; H02M 3/01; H02M 3/22; H02M 3/24; H02M 3/28; H02M 3/315;
(Continued)

(56) References Cited

U.S. PATENT DOCUMENTS 11,349,401 B1 * 5/2022 Zafarana ............... H02M 1/342
2018/0294731 A1 * 10/2018 Song .................. H02M 3/33523
(Continued)

OTHER PUBLICATIONS

Madiwale "Digital Control Enables High Reliability DC-to-DC Power Conversion with Active Snubbing" Analog Devices <URL: https://www.analog.com/en/technical-articles/digital-control-enables-high-reliability-dc-to-dc-power-conversion-with-active-snubbing.html> Retrieved on Aug. 23, 2022 (8 pages).
(Continued)

*Primary Examiner* — Thienvu V Tran
*Assistant Examiner* — Carlos O Rivera-Perez
(74) *Attorney, Agent, or Firm* — CANTOR COLBURN LLP

(57) ABSTRACT

An isolated DC/DC converter includes a primary stage, a transformer circuit, a secondary stage, an active clamp, a first current sense node, and a second current sense node. The primary stage includes a primary switching inverter configured to invert the source DC voltage into a high-frequency alternating current (AC) voltage. The transformer circuit adjusts an AC voltage level of the high-frequency AC voltage and outputs an adjusted AC voltage. The secondary stage includes a secondary switching converter to convert the adjusted AC voltage into a secondary voltage, and the active clamp is configured to clamp the secondary voltage to provide an output DC voltage. The first current sense node is included in the primary stage conducts a source current having a first current level, and the second current sense node is included in the secondary stage and conducts a clamp current having a second current level.

13 Claims, 3 Drawing Sheets

(51) Int. Cl.
  *H02M 1/32* (2007.01)
  *H02M 1/34* (2007.01)
  *H02M 3/28* (2006.01)
(52) U.S. Cl.
  CPC ............... *H02M 1/34* (2013.01); *H02M 3/28* (2013.01); *H02M 3/33573* (2021.05); *H02M 3/33592* (2013.01)
(58) Field of Classification Search
  CPC ............... H02M 3/3155; H02M 3/335; H02M 3/33507; H02M 3/33515; H02M 3/33523; H02M 3/3353; H02M 3/33538; H02M 3/33546; H02M 3/33553; H02M 3/33569; H02M 3/33571; H02M 3/33573; H02M 3/33576; H02M 3/33584; H02M 3/33592; H02M 1/00; H02M 1/0009; H02M 1/0038; H02M 1/0043; H02M 1/0048; H02M 1/0054; H02M 1/0058; H02M 1/0087; H02M 1/14; H02M 1/143; H02M 1/15; H02M 1/32; H02M 1/325; H02M 1/34–348
  USPC ................. 363/13, 15–23, 50–56.12, 95–98, 363/131–134; 323/271–278, 280, 323/282–286, 351
  See application file for complete search history.

(56) References Cited

U.S. PATENT DOCUMENTS

2022/0190734 A1\* 6/2022 Kim ..................... H02M 1/32
2022/0200454 A1\* 6/2022 Kim ................. H02M 3/33584

OTHER PUBLICATIONS

International Search Report with Written Opinion issued in International Application No. PCT/US2023/029719; International Filing Date Aug. 8, 2023; dated Nov. 22, 2023 (15 pages).
Miura et al., "Bidirectional isolated dual full-bridge dc-dc converter with active clamp for EDLC" 2010 IEEE energy conversion congress and exposition, IEEE, (Sep. 2010) pp. 1136-1143.
Panov et al., "Transformer-flux-balancing control in isolated bidirectional DC-DC converters" 2014 IEEE Applied Power Electronics Conference and Exposition-APEC 2014. IEEE, (Mar. 2014) pp. 49-56.
Wu et al., "Soft-switching bidirectional isolated full-bridge converter with active and passive snubbers" IEEE Transactions on Industrial Electronics 61.3 (Mar. 2014) pp. 1368-1376.

\* cited by examiner

ACTIVE CLAMP DC/DC CONVERTER INCLUDING CURRENT SENSE PEAK CONTROL MODE CONTROL

BACKGROUND

The present disclosure relates to isolated direct current-to-direct current (DC/DC) converters, and in particular, to an active clamp DC/DC converter capable of facilitating a current sense approach for implementing a peak current mode control scheme.

DC/DC converters are utilized for converting a DC voltage to a different voltage level to support the needs of utilization equipment such as consumer, industrial and military electronics. Semiconductor switching devices used in power converters are subjected to transient voltage and current stresses due to parasitic elements in the circuit that, when unlimited, can exceed the device ratings resulting in poor reliability and/or failure. Parasitic elements include leakage inductance of an isolation transformer, circuit board inductive and capacitive effects. A standard design practice is to use clamping devices in what are called snubber circuits to limit transient voltage excursions on the switching devices to well below their rated levels.

Active clamp snubber circuits (referred to as "active clamps") are typically preferred over passive resistive capacitor (RC) voltage transient protection circuits (referred to as "RC snubbers") to limit voltage transients applied to switching devices. This is due to their lossless operating characteristics resulting in increased efficiency, and improved reliability. However, active clamps can result in higher circulating currents compared to passive snubbers. The circulating currents, in turn, result in current waveforms different from those that are traditionally used to implement robust control techniques such as peak current mode control.

SUMMARY

According to a non-limiting embodiment, an isolated DC/DC converter includes a primary stage, a transformer circuit, a secondary stage, an active clamp, a first current sense node, and a second current sense node. The primary stage includes a primary switching inverter configured to invert the source DC voltage into a high-frequency alternating current (AC) voltage. The transformer circuit adjusts an AC voltage level of the high-frequency AC voltage and outputs an adjusted AC voltage. The secondary stage includes a secondary switching converter to convert the adjusted AC voltage into a secondary voltage, and the active clamp is configured to clamp the secondary voltage to provide an output DC voltage. The first current sense node is included in the primary stage of the converter consisting of a source current having a first current level, and the second current sense node is included in the secondary stage and includes of a second current level related to the current (e.g., the clamp current) flowing through the active clamp.

In accordance with a non-limiting embodiment, the first current sense node is in signal communication with an input of the primary switching inverter, and the second current sense node is in signal communication with the active clamp.

In accordance with a non-limiting embodiment, the active clamp comprises one or more clamp switches connected to the secondary switching converter, a clamp capacitor including a first capacitor terminal connected to one or more clamp switches and a second capacitor terminal connected to the secondary switching converter.

In accordance with a non-limiting embodiment, the first current sense node includes a first current sense transformer configured to sense the source current flowing through the primary side of the DC/DC converter and the second current sense node is implemented with a second current sense transformer configured to sense the clamp current flowing through the active clamp.

In accordance with a non-limiting embodiment, the primary switching inverter is an H-bridge switching converter, and the secondary switching converter is an H-bridge switching converter.

In accordance with a non-limiting embodiment, the secondary voltage has a different voltage level than the source voltage.

In accordance with a non-limiting embodiment, the isolated DC/DC converter further comprises an output filter including a first terminal connected in common with the secondary switching converter and the clamp switch, and a second terminal connected in common with the clamp capacitor and the secondary switching converter.

According to another non-limiting embodiment, a peak current measurement system includes an isolated direct current-to-direct current (DC/DC) converter and a current differential module. The isolated DC/DC converter includes a primary stage containing a primary switching inverter configured to conduct a source current, and a secondary stage containing a secondary switching converter and an active clamp in signal communication with the secondary switching converter. The active clamp is configured to conduct a clamp current. The current differential module is in signal communication with the isolated DC/DC converter. The current differential module is configured to measure the source current and the clamp current and to determine a control current based on a difference between the source current and the clamp current.

In according with a non-limiting embodiment, the peak current measurement further comprises a peak current controller in signal communication with the current differential module. The current differential module configured to determine a peak current level of the control current.

In accordance with another non-limiting embodiment, the peak current controller is configured to output a load control signal in response to detecting the peak current level, In accordance with another non-limiting embodiment, the isolated DC/DC converter further comprises a first current sense node and a second current sense node. The first current sense node is included in the primary stage and is configured to conduct the source current having a first current level. The second current sense node is included in the secondary stage and is configured to conduct the clamp current having a second current level.

In accordance with a non-limiting embodiment, the first current sense node is in signal communication with an input of the primary switching inverter, and the second current sense node is in signal communication with the active clamp.

In accordance with a non-limiting embodiment, the current differential module comprises a first current sense transformer and a second current sense transformer. The first current sense transformer is configured to sense the source current flowing through the primary side of the DC/DC converter. The second current sense transformer is configured to sense the clamp current flowing through the active clamp.

In accordance with a non-limiting embodiment, the current differential module measures the source current flowing through the first current sense node via the first sensing winding and the inverter current sensing winding, and measures the clamp current flowing through the second current sense node via the converter current sensing winding and the second sensing winding.

According to yet another non-limiting embodiment, a method of measuring a peak value of a control current comprises applying an input voltage across a positive primary rail and a negative primary rail of an isolated direct current-to-direct current (DC/DC) converter. The method further comprises driving a source current through a primary stage of the isolated DC/DC converter using a primary switching inverter included in the primary stage, driving a clamp current through a secondary stage of the isolated DC/DC converting using a secondary switching inverter included in the secondary stage, and conducting the clamp current through an active clamp included the secondary stage. The method further comprises measuring the source current and the clamp current using a current differential module, determining the control current based on a difference between the source current and the clamp current, and detecting a peak of the control current to measure the peak value.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
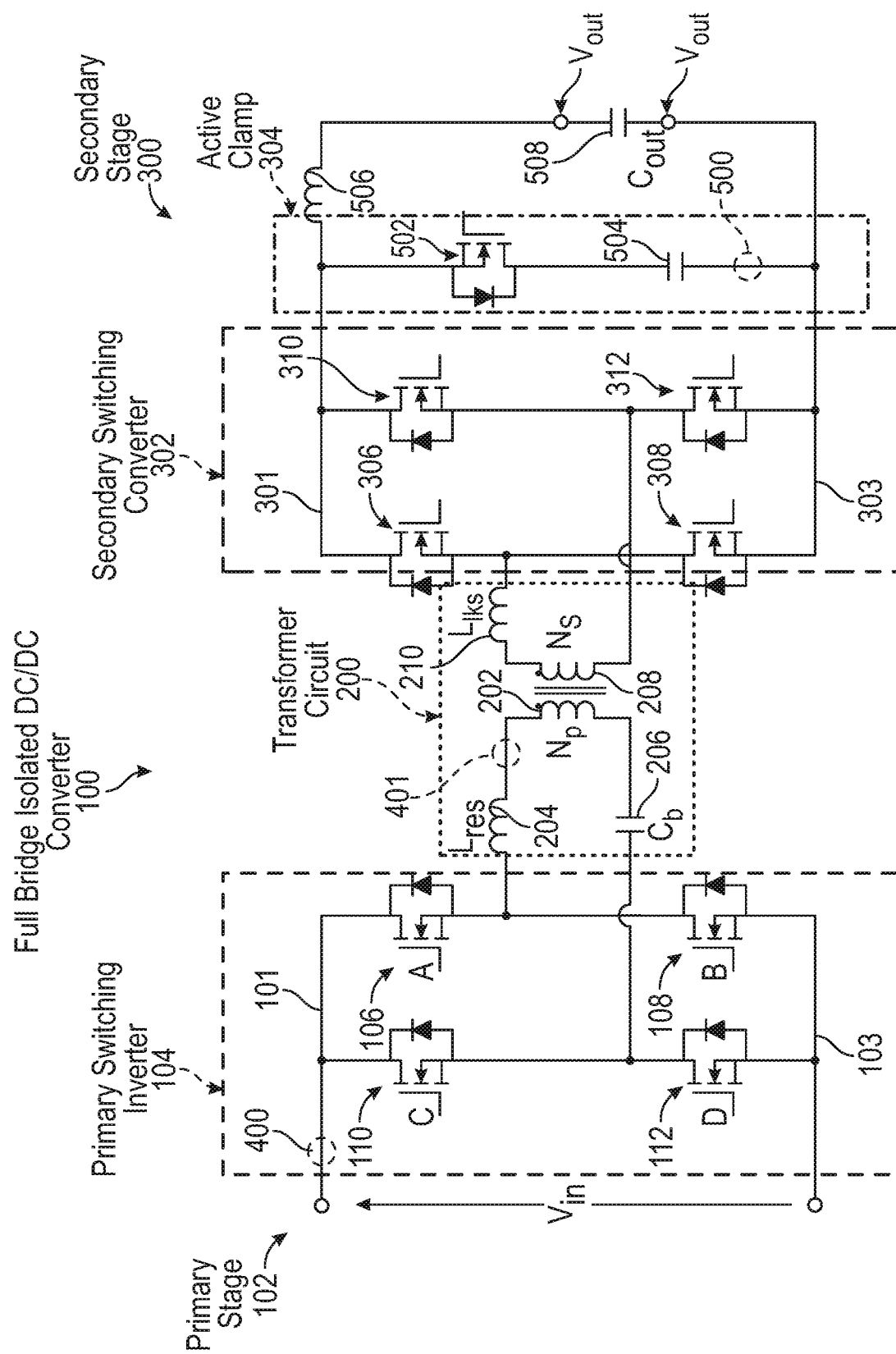
FIG. 1 is a schematic diagram of an isolated DC/DC converter according to a non-limiting embodiment of the present disclosure.

Control schemes are utilized in DC/DC converter applications to achieve various goals such as, for example, stable output voltage regulation, stability in the face of line and load transients, excellent input line rejection performance, fast current limiting, short circuit protection, and transformer balancing. One such control scheme referred to as "peak current mode control," can be utilized in an isolated phase shifted DC/DC converter to control the switching time of semiconductor switches. Controlling switching times of the semiconductor switching devices, in turn, provides for delivery of regulated DC power to an electrical load such as, for example, an antenna. Peak current mode control schemes monitor the current signal output from the DC/DC converter, and control the switching time of the electronic device (e.g., a semiconductor switch) in response to detecting a peak value of the monitored current signal. The monitored current signal can be a direct equivalent of the output inductor current in a non-isolated DC/DC converter or a combination of the output inductor current and the transformer magnetizing current in an isolated DC/DC converter. Peak current mode control, as the name suggests, involves control action taken at the peak of a monitored current signal. Hence, the monitored current signal is expected to have a rising (positive) slope which is terminated by the control action taken when the signal crosses a controlled threshold value. In the absence of the rising (positive) slope current signal, peak current mode control cannot be implemented and its consequent benefits in performance and robustness of the DC/DC converter cannot be leveraged.

RC snubbers can be utilized to protect the semiconductor switching devices in the DC/DC converter from voltage transients that appear at their terminals. However, RC suffer from high-power dissipation which reduces the overall power efficiency of the DC/DC converter. Active clamps can replace RC snubbers to provide voltage transient protection with low power dissipation and improved efficiency, but they introduce the larger circulating currents in the DC/DC converter. These circulating currents change the waveshape of the currents that are sensed to create the current signal that is monitored for peak current mode control. In other words, the circulating currents due the active clamp operation "hide" the required current waveform that needs to be monitored for the implementation of peak current model control.

Various non-limiting embodiments described herein provide an isolated DC/DC converter that implements an active clamp to protect the semiconductor switching devices from voltage transients, while also facilitating accurate peak current sensing that allows for implementing a peak current mode control scheme. The isolated DC/DC converter includes a first current sense node established on the primary side of the DC/DC converter, and a second current sense node established in the active clamp circuit. A first current level (e.g., the input current to the DC/DC converter) current can be determined by measuring the current flowing into the first current sense node, while a second current level (e.g., the level of current flowing through the active clamp) can be determined by measuring the current flowing through the second current sense node. The difference between the second current level and the first current provides a current differential value (ΔI). This current differential essentially extracts the required "rising (positive slope)" current signal by removing the contribution of the circulating current from the clamp. The rising (positive) slope current signal is an accurate representation of the output inductor current and the transformer magnetizing current, hence, suitable for use in a peak current mode control scheme.

By subtracting the clamp circuit current sensed by the second current sense device from the input current sensed by the first current sense devices, the necessary current information to implement peak current mode control and leverage all its benefits is now available. According to a non-limiting embodiment, two current sense transformers followed by a current differential module can be provided to perform the subtraction arithmetic, which recreates the current signal to implement peak current mode control. Accordingly, the isolated DC/DC converter provided herein does not require bulky and lossy shunt resistors to accurately sense and measure the output current. The current information provided by the current differential module provides the necessary information to implement a peak current mode control. As a result, while the active clamp limits the transient voltage excursion at the switching devices without the lossy and inefficiencies of the passive snubbers, peak current mode control provides for stable output voltage regulation, input voltage and load current disturbance rejection, short circuit protection and transformer balancing.

With reference now to FIG. 1, a circuit schematic of an isolated DC/DC converter 100 is illustrated according to a non-limiting embodiment. In one or more embodiments, the isolated DC/DC converter 100 is constructed as a full bridge isolated DC/DC converter 100 including a primary stage 102, a transformer circuit 200, and a secondary stage 300.

The primary stage 102 includes a primary DC bus having a positive primary rail 101 and a negative primary rail 103. Included in the primary stage 102 is a primary switching inverter 104 that is connected across the primary DC bus. The primary switching inverter 104 is configured to receive a source DC voltage (Vin) and to invert the source DC voltage (Vin) into a high-frequency alternating current (AC) voltage.

The primary switching inverter 104 includes a first inverter switch 106, a second inverter switch 108, a third inverter switch 110, and a fourth inverter switch 112. According to one or more non-limiting embodiments, the inverter switches (collectively referred to as inverter switches 106-112) are connected together to form an H-bridge switching inverter, which inverts the source DC voltage to generate the high-frequency alternating current AC voltage by alternating the switching (e.g., the switching on/off times) of the first inverter switch 106 and the fourth inverter switch 112 with respect to the second inverter switch 108 and third inverter switch 110.

The transformer circuit 200 is configured to adjust an AC voltage level voltage. For example, the transformer circuit 200 can receive the high-frequency AC voltage having a first AC voltage level and reduces the high-frequency AC voltage "e.g., steps down the AC voltage" to generate a second AC voltage level that is less than the first AC voltage level.

According to a non-limiting embodiment, the transformer circuit 200 includes a primary winding 202, a primary inductor 204, a primary capacitor 206, a secondary winding 208, and a secondary inductor 210. The primary winding 202 includes a first primary terminal connected to a first primary inductor terminal of the primary inductor 204 and a second primary terminal connected to a first primary capacitor terminal of the primary capacitor 206. The opposing second primary inductor terminal of the primary inductor 204 is connected in common with the first inverter switch 106 and the second inverter switch 108. The opposing second primary capacitor terminal of the primary capacitor 206 is connected to a secondary switching converter 302 included in the secondary stage 300 as described in greater detail below.

The secondary winding 208 is magnetically coupled to the primary winding 202 to establish a transformer between the primary switching inverter 104 and the secondary switching converter 302. The secondary winding 208 includes first and second secondary winding terminals for conducting electrical current induced therein in response to flowing electrical current through the primary winding 202. One secondary winding terminal is connected to a secondary inductor terminal of the secondary inductor 210. The opposing secondary winding terminal is connected to the secondary switching converter 302. The opposing secondary winding terminal of the secondary winding 208 is also connected to the secondary switching converter 302, as described in greater detail below.

The secondary stage 300 includes the secondary switching converter 302 and an active clamp 304. The secondary switching converter 302 is configured to convert the AC voltage output from the transformer circuit 200 into an output DC voltage (Vout) having a different voltage level than the source DC voltage (Vin). The active clamp 304 is connected to the secondary switching converter (e.g., connected in parallel with the converter 302) and is configured to clamp a secondary voltage (e.g., a secondary DC voltage) generated by the secondary switching converter to provide an output DC voltage (Vout) to a load, and reduce, or even entirely prevent, voltage transients (e.g., voltage spikes) from appearing on the terminals of the secondary converter 301. The secondary stage 300 provides a secondary DC bus having a positive secondary rail 301 and a negative secondary rail 303. The positive and negative secondary rails 301 and 303 are coupled with the transformer circuit 200 to receive the high-frequency AC voltage.

The secondary switching converter 302 includes a first converter switch 306, a second converter switch 308, a third converter switch 310, and a fourth converter switch 312. According to one or more non-limiting embodiments, the converter switches (collectively referred to as inverter switches 306, 308, 310, 312) are connected together to form an H-bridge switching converter. The first converter switch 306 and the second converter switch 308 are connected in common with the secondary inductor 210, while the third converter switch 310 and the fourth converter switch 312 are connected in common with the secondary winding 208. Accordingly, the secondary switching converter 302 is configured to convert the AC voltage into output DC voltage (Vout) by controlling the switching (e.g., the switching on/off times) of the first and fourth converter switches 306 and 312 with respect to the second and third converter switches converts 308 and 310.

The active clamp 304 includes a clamp switch 502 and a clamp capacitor 504. The active clamp is coupled to the output filter section of the DC/DC converter. According to one or more non-limiting embodiments, the output filter can be constructed using, for example, an output inductor (Lout) 506 and an output capacitor (Cout) 508. A first inductor terminal of the output inductor (Lout) is connected in common with the secondary switching converter 302 (e.g., the third converter switch 310) and a second opposing inductor terminal connected to a first capacitor terminal of the output capacitor (Cout). The second opposing capacitor terminal is connected in common with the clamp capacitor 504 and the secondary switching converter 302 (e.g., the fourth converter switch 312). Accordingly, a voltage across the output capacitor (Cout) 508 produces the output DC voltage (Vout) that is delivered to the utilization equipment.

The clamp switch 502 including a first clamp terminal connected in common with the secondary switching converter 302 (e.g., the first and third converter switches 306 and 310) and the output filter (e.g., the output inductor 506). A second clamp terminal of the clamp switch 502 is connected to a first clamp terminal of clamp capacitor 504, while the opposing second clamp terminal of the clamp capacitor 504 is connected in common with the secondary switching converter 302 (e.g., the second and fourth converter switches 308 and 312) and the output filter (e.g., the output capacitor 508).

According to one or more non-limiting embodiments of the present disclosure, the isolated DC/DC converter 100 includes a first current sense node 400 and a second current sense node 500, which allows for implementing a peak current mode control scheme along with the active clamp 304, without suffering from inaccurate current sensing caused by high-circulating currents caused by conventional active clamp DC/DC converters.

The first current sense node 400 is established, for example, at the primary stage and is in signal communication with an input of the primary switching inverter 104. The first current sense node 400 is configured to conduct a source current ($I_{DCSOURCE}$) having a first current level (e.g., the input current level of the DC/DC converter 100). Although the source current is designated as "$I_{DCSOURCE}$", it should be appreciated that primary sense location 401 can be located in series with the main transformer (e.g., implemented using primary winding 202 and secondary winding 208), which allows the sensed currents to be AC. According to a non-limiting embodiment, the first current sense node 400 is established on the primary positive rail 101. It should be appreciated, however, that the first current sense node 400 may be located at another location capable of conducting the source current ($I_{DCSOURCE}$) through the primary stage 102 such as location represented by the current sense node 401. In one or more non-limiting embodiments, the first current sense node 400 includes a current sense device such as a current sense transformer to measure the source current ($I_{DCSOURCE}$) flowing through the first current sense node 400.

The second current sense node 500 is established, for example, at the secondary stage 300 and in signal communication with the active clamp 304. The second current sense node is configured to conduct a clamp current ($I_{CLAMP}$) having a second current level (e.g., the level of current flowing through the active clamp 504). According to a non-limiting embodiment, the second current sense node 500 is established between the clamp capacitor 504 and the negative secondary rail 303. It should be appreciated, however, that the second current sense node 500 may be located at another location capable of conducting the clamp current ($I_{CLAMP}$) through the active clamp 504. In one or more non-limiting embodiments, the second current sense node 500 includes current sense device such as a current sense transformer to measure the clamp current ($I_{CLAMP}$) flowing through the second current sense node 500.

The first current sense node 400 allows for measuring the current level of the source current ($I_{DCSOURCE}$), while the second current sense node 500 allows for measuring the current level of the clamp current ($I_{CLAMP}$). As described herein, the difference between the source current and the clamp current is indicative of a control current ($I_{CS}$) (i.e., $I_{DCSOURCE} - I_{CLAMP} = I_{CS}$). The control current ($I_{CS}$) can then be used to control one or more semiconductor switches to achieve the objective of stable regulation of the output DC voltage (Vout) and protection of the DC/DC converter.

Figure 2:
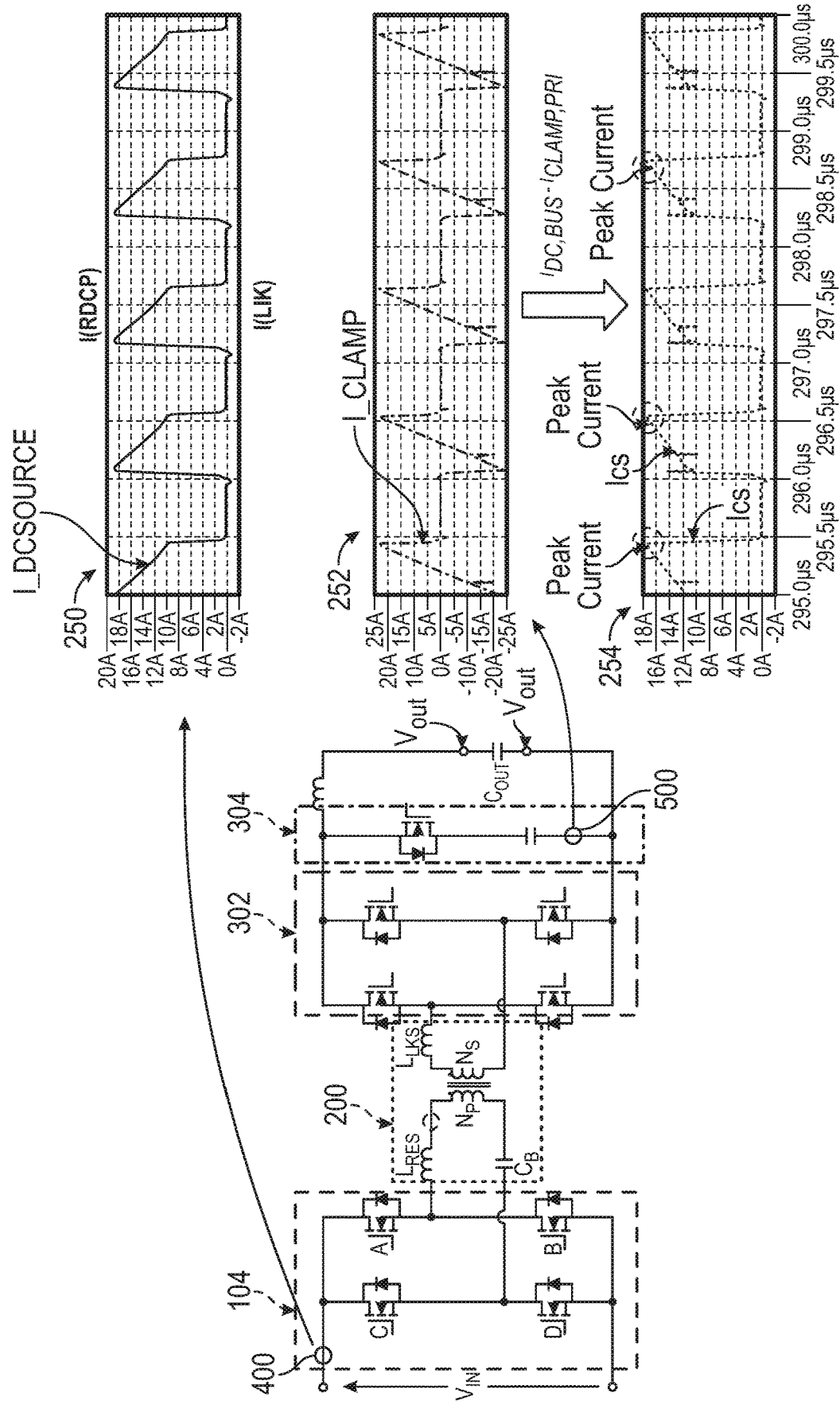
FIG. 2 depicts signal diagrams corresponding to the current measured at different locations of the isolated DC/DC converter according to a non-limiting embodiment of the present disclosure.

Referring to FIG. 2, for example, signal diagrams 250, 252 and 254 corresponding to the current flowing through the isolated DC/DC converter are illustrated according to a non-limiting embodiment of the present disclosure. Signal diagram 250 illustrates the source current ($I_{DCSOURCE}$) measured at the first current sense node 400. Signal diagram 252 illustrates the clamp current ($I_{CLAMP}$) measured at the second current sense node 500. Signal diagram 254 illustrates the control current ($I_{CS}$) obtained when subtracting the clamp current ($I_{CLAMP}$) from the source current ($I_{DCSOURCE}$). In other words, the difference between the source current ($I_{DCSOURCE}$) and the clamp current ($I_{CLAMP}$) effectively yields a control current ($I_{CS}$), which can be used to implement a peak current mode control scheme that can accurately and precisely operate the switching devices to regulate the output DC voltage (Vout).

Figure 3:
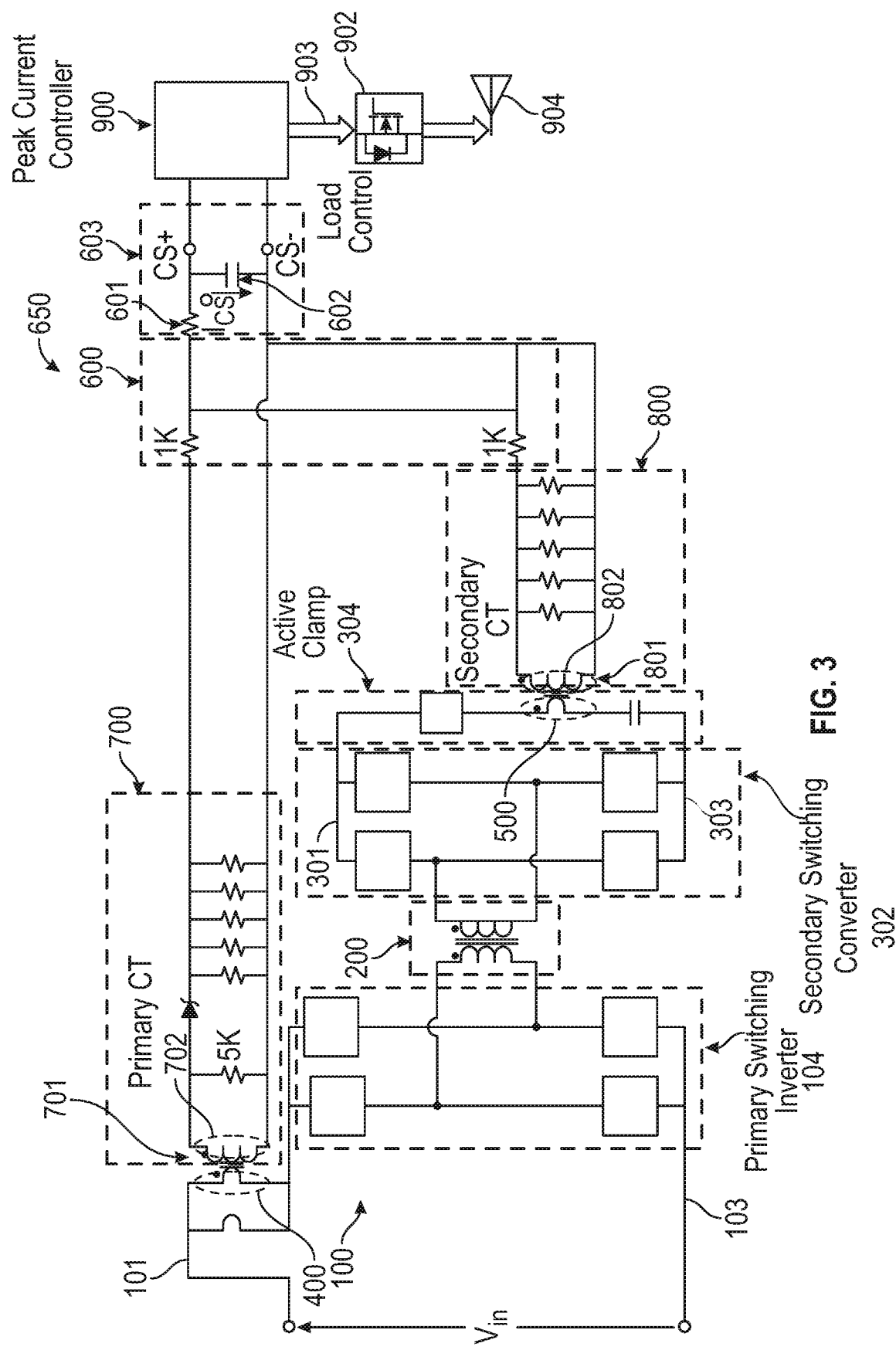
FIG. 3 is a schematic diagram illustrating a peak current measurement system including the isolated DC/DC converter shown in FIG. 1 according to a non-limiting embodiment.

Turning now to FIG. 3, a peak current measurement system 650 is illustrated according to a non-limiting embodiment. The peak current measurement system 650 includes the isolated DC/DC converter 100, along with a current differential module 600 and a peak current controller 900. The isolated DC/DC converter 100 operates according to the descriptions described in detail above. Therefore, details of the isolated DC/DC converter will not be repeated for the sake of brevity.

The current differential module 600 is in signal communication with the DC/DC converter to provide a peak current measurement system 650. The current differential module 600 includes a first current sense input 702 in signal communication with the first current sense node 400 and a second current sense input 802 in signal communication with the second current sense node 500. According to a non-limiting embodiment of the present disclosure, the current differential module 600 is configured to determine the difference between the source current ($I_{DCSOURCE}$) and the clamp current ($I_{CLAMP}$), which in turn yields the control current ($I_{CS}$) as described above.

According to a non-limiting embodiment illustrated in FIG. 3, the current differential module 600 includes a differential current sensing circuit 600 comprising a primary stage current sensing circuit 700 and a secondary stage current sensing circuit 800. The primary stage current sensing circuit 700 is in signal communication with the first current sense node 400 via the first differential input 702. The primary side current sensing circuit 700, as shown in FIG. 3, includes a current sense transformer 701. The primary winding of the current sense transformer 701 is in series with the positive rail 101 of the primary side bridge of the DC/DC converter. The secondary winding of the current sense transformer 701 carries a current scaled by the turns ratio of current sense transformer 701. The current passes through the Schottky diode which prevents reverse current flow and a paralleled chain of resistors. The resistors, also known as burden resistors, convert the secondary current into a voltage.

The secondary stage current sensing circuit 800 is in signal communication with the second current sense node 500 via the second current sense transformer 801, and includes a secondary side current sense transformer 801. In at least one non-limiting embodiment, similar to the primary side current sense transformer 701, the secondary side current sense transformer 801 senses the clamp current flowing through the active clamp 304.

The secondary winding of the current sense transformer 801 carries a current scaled by the turns ratio of the current sense transformer 801. A Schottky diode is missing in the secondary side current sense circuit since the current is bidirectional and reverse current should be allowed to flow. The secondary current flows through a parallel chain of "burden" resistors that convert the current into a voltage.

The voltage signal from the primary side current sense transformer 702 and that from the secondary side current sense transformer 802 are algebraically "summed" by the differential circuit 600. In one or more non-limiting embodiments, a low pass filter 603 can be coupled between differential circuit 600 and the peak current controller 900. The low pass filter 603 can be implemented as RC filter including a filter resistor 601 and a filter capacitor 602. The voltage across the filter capacitor 602 is the required sense signal that can be monitored to implement peak current mode control. The turns ratio of the current sense transformers 702 and 802 and the burden resistors in the respective secondary side circuits are chosen such that extraction of the circulating current from the active clamp is performed at the right level to result in the peak current sense signal across the filter capacitor 602.

Although a two individual sensing circuits 700 and 800 are illustrated, for example, to determine the difference between the source current ($I_{DCSOURCE}$) and the clamp current ($I_{CLAMP}$), it should be appreciated that other techniques may be used without departing from the scope of the present disclosure. For example, the individual sensing circuits 700 and 800 can be replaced by Hall Effect sensors or current sense resistors and the current differential can be performed with an analog differential amplifier. A first terminal (e.g., positive input terminal) of the operational amplifier can be connected to the first current sense node 400 via the first differential input 702. Similarly, a second terminal of the operational amplifier (e.g., negative input terminal) can be connected to the second current sense node 500 via the second differential input 802. Accordingly, the operational amplifier can determine the difference between the source current ($I_{DCSOURCE}$) and the clamp current ($I_{CLAMP}$) to determine the level of the control current ($I_{CS}$). Alternatively, the sensed signal can be extracted by performing the "subtraction" digitally after reading the individual sense signals into a digital signal processor.

In another example, the individual sensing circuits 700 and 800 can be replaced with a current sensing controller. The current sensing controller can include a first input in signal communication with the first current sense node 400 via the first differential input 702 and a second input in signal communication with the second current sense node 500 via the second differential input 802. Accordingly, the current sensing controller can calculate the difference between the source current ($I_{DCSOURCE}$) and the clamp current ($I_{CLAMP}$), which in turn indicates the level of the control current ($I_{CS}$).

The peak current controller 900 is in signal communication with the current differential module 600 to receive the control current ($I_{CS}$). Accordingly, the peak current controller 900 can monitor the level of the control current ($I_{CS}$), and detect a peak current level of the control current ($I_{CS}$). In one or more non-limiting embodiments, when the peak current level of the control current ($I_{CS}$) is detected, the peak current controller 900 outputs a load control signal 903, which controls operation of a load 902. In one or more non-limiting embodiments, the load is a semiconductor switch 902 including an input configured to receive the load control signal 901 and an output configured to control an antenna 904. In this manner, the switch 902 can be activated to energize the antenna 904 in response to the peak current controller 900 detecting the peak current of the control current ($I_{CS}$).

As described herein, various non-limiting embodiments provide an isolated DC/DC converter that includes an active clamp configured to improve the reliability and performance of a DC/DC converter by limiting the by voltage transients that the switching devices are subjected to. The isolated DC/DC converter includes a first current sense node that conducts current having first current level indicative of an input current level of the DC/DC converter and a second current sense node that conducts current having a second current level indicative of the level of current flowing through the active clamp. A current differential value (ΔI) between the second current level and the first current level allows for determining an accurate peak current level of the current flowing through the DC/DC converter. Accordingly, the isolated DC/DC converter leverages the benefits of reduced power dissipation, increased efficiency, and improved reliability that are provided by active clamp circuitry, while also allowing for implementation of a peak current mode control scheme with improved performance benefits such as voltage regulation, line and load disturbance, short circuit protection, etc.

The corresponding structures, materials, acts, and equivalents of all means plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form detailed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the various embodiments with various modifications as are suited to the particular use contemplated.

While the preferred embodiments have been described, it will be understood by those skilled in the art, both now and in the future, may make various improvements and enhancements which fall within the scope of the claims which follow. These claims should be construed to maintain the proper protection for the disclosure as first described.

What is claimed is:

1. An isolated direct current-to-direct current (DC/DC) converter comprising: a primary stage including a primary switching inverter configured to receive a source DC voltage and to invert the source DC voltage into a high-frequency alternating current (AC) voltage; a transformer circuit configured to adjust an AC voltage level of the high-frequency AC voltage and output an adjusted AC voltage; a secondary stage including a secondary switching converter configured to convert the adjusted AC voltage into a secondary voltage; an active clamp in signal communication with the secondary switching converter and configured to clamp the secondary voltage to provide an output DC voltage; a first current sense node included in the primary stage and configured to conduct a source current having a first current level; and a second current sense node included in the secondary stage and configured to conduct a clamp current having a second current level; a current differential module including a first current sense input in signal communication with the first current sense node and a second current sense input in signal communication with the second current sense node, the current differential module configured to a current differential between the second current level and the first current level and to determine a control current based on the current differential; a peak current controller in signal communication with the current differential module, the peak current controller configured to determine a peak current level of the control current and to output a load control signal in response to detecting the peak current level; and a load in signal communication with the current differential module, the load configured to receive the load control signal and to output a regulated DC power at the peak current level.

2. The isolated DC/DC converter of claim 1, wherein the first current sense node is in signal communication with an input of the primary switching inverter, and the second current sense node is in signal communication with the active clamp.

3. The isolated DC/DC converter of claim 1, wherein the first current sense node includes a first current sense transformer configured to sense the source current flowing through the primary stage of the isolated DC/DC converter and the second current sense node is implemented with a second current sense transformer configured to sense the clamp current flowing through the active clamp.

4. The isolated DC/DC converter of claim 3, wherein the active clamp comprising:
one or more clamp switches connected to the secondary switching converter; and
a clamp capacitor including a first capacitor terminal connected to one or more clamp switches and a second capacitor terminal connected to the secondary switching converter.

5. The isolated DC/DC converter of claim 4, wherein the primary switching inverter is an H-bridge switching inverter, and the secondary switching converter is an H-bridge switching converter.

6. The isolated DC/DC converter of claim 5, wherein the secondary voltage has a different voltage level than the source DC voltage.

7. The isolated DC/DC converter of claim 4, further comprising an output filter including a first terminal connected in common with the secondary switching converter and the clamp switch, and a second terminal connected in common with the clamp capacitor and the secondary switching converter.

8. A peak current measurement system comprising: an isolated direct current-to-direct current (DC/DC) converter comprising: a primary stage including a primary switching inverter configured to conduct a source current; a secondary stage including a secondary switching converter and an active clamp in signal communication with the secondary switching converter, the active clamp configured to conduct a clamp current; a current differential module in signal communication with the isolated DC/DC converter, the current differential module configured to measure the source current and the clamp current, and to determine a control current based on a difference between the source current and the clamp current; a peak current controller in signal communication with the current differential module, the peak current controller configured to determine a peak current level of the control current and to output a load control signal in response to detecting the peak current level; and a load in signal communication with the current differential module, the load configured to receive the load control signal and to output a regulated DC power at the peak current level of the control current.

9. The peak current measurement system of claim 8, wherein the isolated DC/DC converter further comprising:

a first current sense node included in the primary stage and configured to conduct the source current having a first current level; and
a second current sense node included in the secondary stage and configured to conduct the clamp current having a second current level.

10. The peak current measurement system of claim 9, wherein the first current sense node is in signal communication with an input of the primary switching inverter, and the second current sense node is in signal communication with the active clamp.

11. The peak current measurement system of claim 10, wherein the current differential module comprising: a first current sense transformer configured to sense the source current flowing through the primary stage of the isolated DC/DC converter; and a second current sense transformer configured to sense the clamp current flowing through the active clamp.

12. The peak current measurement system of claim 11, wherein the current differential module measures the source current flowing through the first current sense node via the first sensing winding and the inverter current sensing winding, and measures the clamp current flowing through the second current sense node via the converter current sensing winding and the second sensing winding.

13. A method of measuring a peak value of a control current, the method comprising: applying an input voltage across a positive primary rail and a negative primary rail of an isolated direct current-to-direct current (DC/DC) converter; driving a source current through a primary stage of the isolated DC/DC converter using a primary switching inverter included in the primary stage; driving a clamp current through a secondary stage of the isolated DC/DC converting using a secondary switching inverter included in the secondary stage; conducting the clamp current through an active clamp included the secondary stage; measuring the source current and the clamp current using a current differential module; determining the control current based on a difference between the source current and the clamp current; and detecting a peak current level of the control current so as to measure the peak current level; generating a load control signal in response to detecting the peak current level; and in response to delivering the load control signal to a load, outputting a regulated DC power from the load at the peak current level of the control current.

* * * * *